United States Patent
Verheijen et al.

(10) Patent No.: US 10,391,763 B2
(45) Date of Patent: Aug. 27, 2019

(54) INKJET PRINTING SYSTEM AND METHOD FOR PROCESSING SUBSTRATES

(71) Applicant: MEYER BURGER (NETHERLANDS) B.V., Eindhoven (NL)

(72) Inventors: Johan Verheijen, Oirshot (NL); Laurentius Hendrikus Adrianus Van Dijk, Turnhout (BE)

(73) Assignee: MEYER BURGER (NETHERLANDS) B.V., Eindhoven (NL)

( * ) Notice: Subject to any disclaimer, the term of this patent is extended or adjusted under 35 U.S.C. 154(b) by 0 days.

(21) Appl. No.: 16/070,968

(22) PCT Filed: Jan. 20, 2017

(86) PCT No.: PCT/NL2017/050038
§ 371 (c)(1),
(2) Date: Jul. 18, 2018

(87) PCT Pub. No.: WO2017/126967
PCT Pub. Date: Jul. 27, 2017

(65) Prior Publication Data
US 2019/0023003 A1 Jan. 24, 2019

(30) Foreign Application Priority Data
Jan. 21, 2016 (NL) ...................... 2016137

(51) Int. Cl.
*B41J 2/045* (2006.01)
*H01L 21/67* (2006.01)
(Continued)

(52) U.S. Cl.
CPC ....... *B41J 2/04505* (2013.01); *B41J 2/04586* (2013.01); *B41J 3/407* (2013.01);
(Continued)

(58) Field of Classification Search
CPC .... B41J 2/04505; B41J 2/04586; B41J 3/407; B41J 11/06; B41J 25/001;
(Continued)

(56) References Cited

U.S. PATENT DOCUMENTS 6,436,843 B1   8/2002   Meinhold et al.
7,611,217 B2  11/2009   Shamoun et al.
(Continued)

FOREIGN PATENT DOCUMENTS

EP   2 324 932 A1   5/2011
JP   2007-007522 A   1/2007
(Continued)

OTHER PUBLICATIONS

International Search Report (PCT/ISA/210) issued in PCT/NL2017/050038, dated Apr. 7, 2017.
(Continued)

*Primary Examiner* — Thinh H Nguyen
(74) *Attorney, Agent, or Firm* — Birch, Stewart, Kolasch & Birch, LLP

(57) ABSTRACT

Inkjet printing system for processing substrates including a chuck for placement of a substrate and an inkjet printing head with at least one nozzle. Each chuck has chuck reference marks, each of which is associated with an associated camera. An electronic controller assembly is configured to take a set of images each instance a substrate having substrate reference marks has been placed on a chuck, with each image containing a chuck reference mark and a substrate reference mark. For each image, the position of the chuck relative to the camera and the position of the substrate relative to the camera is determined. Subsequently, the substrate position relative to the chuck is calculated and based thereon the firing of the at least one nozzle is timed and the movement of the printing motion assembly is
(Continued)

controlled so that the liquid drops are accurately positioned on the substrate.

16 Claims, 3 Drawing Sheets

(51) Int. Cl.
  *H01L 21/68* (2006.01)
  *B41J 25/00* (2006.01)
  *G06T 7/00* (2017.01)
  *H01L 21/768* (2006.01)
  *B41J 3/407* (2006.01)
  *B41J 11/06* (2006.01)

(52) U.S. Cl.
  CPC ............ *B41J 11/06* (2013.01); *B41J 25/001* (2013.01); *G06T 7/001* (2013.01); *H01L 21/6715* (2013.01); *H01L 21/67282* (2013.01); *H01L 21/681* (2013.01); *H01L 21/76838* (2013.01); *G06T 2207/30148* (2013.01)

(58) Field of Classification Search
  CPC ........... G06T 2207/30148; G06T 7/001; H01L 21/6715; H01L 21/67282; H01L 21/681; H01L 21/76838
  See application file for complete search history.

(56) References Cited

U.S. PATENT DOCUMENTS

| | | |
|---|---|---|
| 9,961,782 B2 * | 5/2018 | Pun .................. B05C 5/0208 |
| 2007/0002114 A1 | 1/2007 | Sanekata |
| 2007/0070107 A1 | 3/2007 | Shamoun et al. |
| 2007/0169806 A1 | 7/2007 | Fork et al. |
| 2018/0229497 A1 * | 8/2018 | Darrow .................. B41J 2/2135 |

FOREIGN PATENT DOCUMENTS

| WO | WO 2006/116318 A2 | 11/2006 |
|---|---|---|
| WO | WO 2011/026880 A1 | 3/2011 |

OTHER PUBLICATIONS

Written Opinion (PCT/ISA/237) issued in PCT/NL2017/050038, dated Apr. 7, 2017.

* cited by examiner

INKJET PRINTING SYSTEM AND METHOD FOR PROCESSING SUBSTRATES

FIELD

The invention relates to an inkjet printing system and method for processing substrates.

BACKGROUND

U.S. Pat. No. 6,436,843 B1 discloses a method for applying a coating material on a substrate, wherein a print head is disposed over a substrate which is supported by a chuck. A digital signal processor provides control signals for controlling process parameters for dispensing drops of coating material and for controlling the relative position of the print head and the chuck. The manner in which the relative position between the print head and the chuck is determined is not disclosed.

US2007/169806 A1 discloses a print assembly including a print head and a camera having high magnification capabilities mounted in a rigid mount. The rigid mount with the print head and the camera are mounted over a conveyor for supporting substrates. A computer/workstation is coupled to receive and process imaging data from the camera. With this setup the rigid mount carrying the print head and the camera can be calibrated and registered with respect to a substrate which is on the conveyor. The camera having high magnification capabilities is relatively expensive.

WO2011/026880 A1 discloses a system and a method for centering a print track, on a substrate. Firstly, a printing station deposits a first print track and a marker element. Secondly, a second print track is deposited in a second step, which second print track includes a centering interruption which is positioned and centered with respect to the marker element. The known method, which is primarily concerned with aligning subsequently applied screen printing patterns, may include use of an inspection system including a CCD camera. The inspection system may locate the position of certain features of an incoming substrate and may communicate the inspection results to a system controller for analysis of the orientation and position of the substrate to assist in the precise position of the substrate under a printing head prior to processing the substrate.

U.S. Pat. No. 7,611,217 B2 discloses a method and a system for inkjet drop positioning. The known method includes determining an intended deposition location of an ink drop on a substrate. To that end an ink drop is deposited on the substrate using an inkjet printing system. Subsequently, a deposited location of the deposited ink drop on the substrate is located and the deposited location is compared to the intended location. Then, the difference between the deposited location and the intended location is determined and the difference between the deposited location and the intended location is compensated by adjusting a control parameter of the inkjet system.

This method is time consuming, because it has to be done for each substrate that has to be processed. In view thereof, the known system is not suited for a inkjet printer system in which large numbers of substrates have to be processed within a limited time.

EP 1 888 336 discloses an inkjet printing system including a calibration camera and a vision camera assembly and a fiducial mark on the calibration camera assembly. The vision camera assembly includes a high resolution camera and a low resolution camera with a greater field than the high resolution camera, typically in the order of 10 mm by 10 mm. With the calibration camera the position errors between the print heads can be determined by looking at the printing heads with the calibration camera. When errors are found, these may be adjusted. Both the vision camera assembly and the calibration camera assembly are able to look at the fiducial mark in order to coordinate vision camera assembly and the calibration camera assembly. Once relative positioning between calibration camera assembly and machine vision camera assembly is known, relative positioning between print heads, calibration camera assembly, and machine vision camera assembly may be determined by a computer and may be used for print head and print head carriage adjustment. Further, relative positioning between vision camera assembly and print head carriage frame may be known through the use of common optical strip. This may generally allow a computer to determine relative positioning between substrate and print heads and determine any positioning error therebetween.

In order to accurately determine the position of a substrate relative to a printing head, an expensive dual camera vision assembly including a high resolution and a low resolution camera is necessary as well as a calibration camera assembly. The accuracy and the precision of the known measurement system are determined by the accuracy of the positions of the various cameras. In view thereof, the carriages of the various cameras must be very robust in order to ensure that the relative positions of the cameras of the two systems remain intact. Such robust movable camera carriages are expensive.

EP 2 324 932 A1 discloses an inkjet printing device including a printing head (head module 3), a chuck (substrate support stage 4) and a number of cameras which are fixedly positioned on a base. On the substrate support stage markers m1-m3 are provided. A substrate to be placed on the substrate support stage also includes substrate markers. Information obtained with the cameras about the position of the substrate support stage markers m1-m3 and of the substrate markers is used to rotate the substrate support stage such that the substrate markers are aligned with a scanning direction of the substrate support stage relative to the head module. The head module is controlled to produce an image while scanning the substrate support stage relative to the head module.

SUMMARY

An object of the invention is to provide an inkjet printing system in which the disadvantages of the prior art are alleviated. More particular, it is an object of the invention to provide an inkjet printing system that uses relatively low cost cameras, but with which the deposition of the liquid on the substrate can be effected with a positioning variation around theoretically desired positions that remains during the processing of a large number of substrates within the requirements of the printing job at hand even if a high volume of substrates is supplied in a limited amount of time.

To that end, the invention provides an inkjet printing system configured to inkjet patterns of liquid material on substrates that each have a length and a width or, alternatively, a diameter, wherein each substrate includes at least two substrate reference marks that are spaced from each other at a distance which is larger than at least half of the length, the width or the diameter of the substrate, the inkjet printing system including:
  at least one chuck on which a substrate can be placed, each chuck having a length and a width or, alternatively, a diameter and including at least two visual chuck reference marks that are spaced apart from each other at a distance which is larger than at least half of the length, the width or the diameter of the chuck;

at least one inkjet printing head that includes at least one nozzle that is configured to discharge liquid when the nozzle is fired by a control signal;

a printing motion assembly that supports at least one of the at least one chuck and the at least one inkjet printing head so that a two dimensional printing area on the at least one chuck can be covered with liquid discharged by the at least one printing head;

an electronic controller assembly configured to produce control signals to fire the at least one nozzle and configured to control the printing motion assembly for positioning the at least one printing head relative to the at least one chuck so that the positioning variation with which the liquid is deposited relative to the chuck is less than a first threshold value;

wherein:

each reference mark of the at least one chuck is associated with an associated camera that is directed to the associated chuck reference mark, each camera having a two dimensional matrix of camera pixels, each pixel having a pixel coordinate;

each chuck includes a placement area extending within a boundary;

when a substrate has been placed in or on the placement area of a said chuck, each camera that is associated with a chuck reference mark is also associated with an associated substrate reference mark in that an image taken with a said camera includes an associated chuck reference mark and an associated substrate reference mark;

the controller assembly is configured:

to control the at least two cameras to take a set of images each instance a substrate has been placed on that chuck, wherein each camera takes a single image of the set of images, wherein each single image of the set of images includes an associated chuck reference mark and an associated substrate reference mark;

to determine, for each set of images, the position of the chuck relative to the at least two cameras by detecting, for each image of the set of images, the position of a said chuck reference mark with respect to the camera pixel coordinates of a said associated camera; and to determine, for each set of images, the position of the substrate relative to the at least two cameras by detecting, for each image of the set of images, the position of a said substrate reference mark with respect to the camera pixel coordinates of a said associated camera;

to use these two position determinations to calculate, for each set of images, the substrate position relative to the chuck reference marks and thus relative to the chuck with an accuracy of less than a second threshold value and, based on that relative position, subsequently time the firing of the at least one nozzle of the at least one printing head and control the movement of the printing motion assembly so that the liquid discharged by the inkjet printing head is positioned on the substrate with a positioning variation which is less than the sum of the first and the second threshold values.

In this respect, a substrate reference mark may be a fiducial mark that is applied to the substrate. Alternatively, a substrate reference mark may also be a structural feature of the substrate such as a corner of the substrate or a structural feature on the surface of the substrate.

A substrate may be a wafer for the production of solar cells or for the production of integrated circuits. However, a substrate may also be another object such as printed circuit board or an optical object such as a lens or a mirror.

By virtue of the presence of the visual chuck reference marks on the chuck, the relative position between the chuck and the substrate can be determined very accurately by taking a set of images of the chuck with the substrate placed thereon with at least two relatively low cost cameras, more particularly simple CCD-cameras. Preferably, the set of images is taken in a single shot by controlling the at least two cameras simultaneously to each take an image of the set of images. The accurate determination of the relative position between the chuck and the substrate can be effected by comparing the relative positions of the visual reference marks on the chuck and the substrate reference marks as registered in the set of images taken by the at least two cameras. The comparison is made for each single image that is taken by a single camera, after which the comparison information of each of the cameras is combined to accurately determine the relative position between the chuck and the substrate. The support structure of the at least two cameras does not have to be robust because the position of the at least two cameras relative to the print heads does not play a role in determining the position of the substrate relative to the print head. The positioning variation of the liquid relative to the chuck is, of course, determined by the printing motion assembly that takes care of the relative movement between the chuck and the printing head and must be below a first threshold value. The positioning variation is a quantity of length expressed, for example, in the unit micrometers. This printing motion assembly has to be robust anyway in order to be able to deposit liquid droplets or liquid tracks relative to each other on a substrate with a repeatable precision. With the configuration according to the invention, the determination of the position of the substrate on the chuck can be effected very quickly and with an accuracy that is less than the second threshold, namely by taking a set of images with the at least two cameras after a substrate has been placed on the chuck and some subsequent calculations based on those images. Preferably, the set of images is taken in one shot by simultaneously operating the individual cameras of the at least two cameras. The accuracy is also a quantity of length, for example, expressed in the unit micrometers. Additionally, the determination of the position of the substrate relative to the chuck can be obtained with a camera assembly that is low cost in comparison with the prior art systems. As a consequence, the positioning variation of liquid that has been discharged on the substrate is less than the sum of the first and the second threshold value.

An additional advantage of the inkjet printing system of the invention is that the system is capable of processing relatively large substrates, such as for example solar cells or even solar panels or OLED devices. The size of these solar cells may for example be as much as 120 cm by 60 cm. This is possible by virtue of the fact that the system is provided with a plurality of relatively low cost cameras to take a set of images, in which each image comprises a visual chuck reference mark as well as an associated substrate reference mark to accurately determine the position of the (large) substrate relatively to the chuck. As a result, accurate positioning liquid or liquid drops on relatively large substrates can be achieved with a relatively low cost system as compared to the prior art systems.

The invention also provides a method for inkjetting patterns of liquid material on substrates, the method including:

providing an inkjet system according to the invention; and repeating for the processing of each substrate the following steps:

picking up a substrate and placing a substrate on a said chuck;

controlling the at least two cameras associated with said chuck to take a set of images, with each camera of said at least two cameras taking a single image of the set of images, wherein each single image of the set of images includes an associated chuck reference mark and an associated substrate reference mark;

determining the position of the chuck relative to the at least two cameras by detecting for each image of the set of images the position of a said chuck reference mark with respect to the camera pixel coordinates of a said associated camera; and determining the position of the substrate relative to the at least two cameras by detecting for each image of the set of images the position of a said substrate reference mark of the substrate with respect to the camera pixel coordinates of a said associated camera;

using these two position determinations to calculate the substrate position relative to the chuck reference marks and thus relative to the chuck with an accuracy of less than the second threshold value and, based on that relative position, subsequently timing the firing of the at least one nozzle of the at least one printing head and controlling the movement of the printing motion assembly with a positioning variation of less than the first threshold value so that the liquid discharged by the inkjet printing head is positioned on the substrate with a positioning variation which is less than the sum of the first and the second threshold values.

With this method, the placement of liquid on substrates can be effected very accurately and precisely with a relatively low cost inkjet printing system. The inkjet printing system can be low cost, because low cost cameras, for example simple CCD cameras, are needed to take a set of images of the visual chuck reference marks on an associated chuck and the associated substrate reference marks of the substrate that is placed on the chuck. After having taken the set of images, which is performed every instance after a new substrate has been placed on the chuck, preferably in a single shot in which the at least two cameras are operated simultaneously, calculations suffice to determine the position of the substrate relative to the printing head. This can be done very quickly. Because the distance between the at least two substrate reference marks as well as the distance between the at least two chuck reference marks may be substantial, typically in the order of centimeters, for example even up to 120 cm, multiple cameras, that together cover substantially the entire substrate, are used to determine the position of the substrate relative to the chuck. Because of the relatively large distance between individual cameras of the at least two cameras, the accuracy of the determination of the relative positions of the substrate and the chuck can be very good, even with a low cost camera. With a low cost camera the threshold value of the accuracy can be smaller than 50 micrometer. With a slightly improved CCD camera with a better CCD-sensor the accuracy can be improved dramatically and be typically smaller than 5 micrometer.

Next, various embodiments of the invention will be discussed with reference to an example that is shown in the drawings.

DETAILED DESCRIPTION

Figure 1:
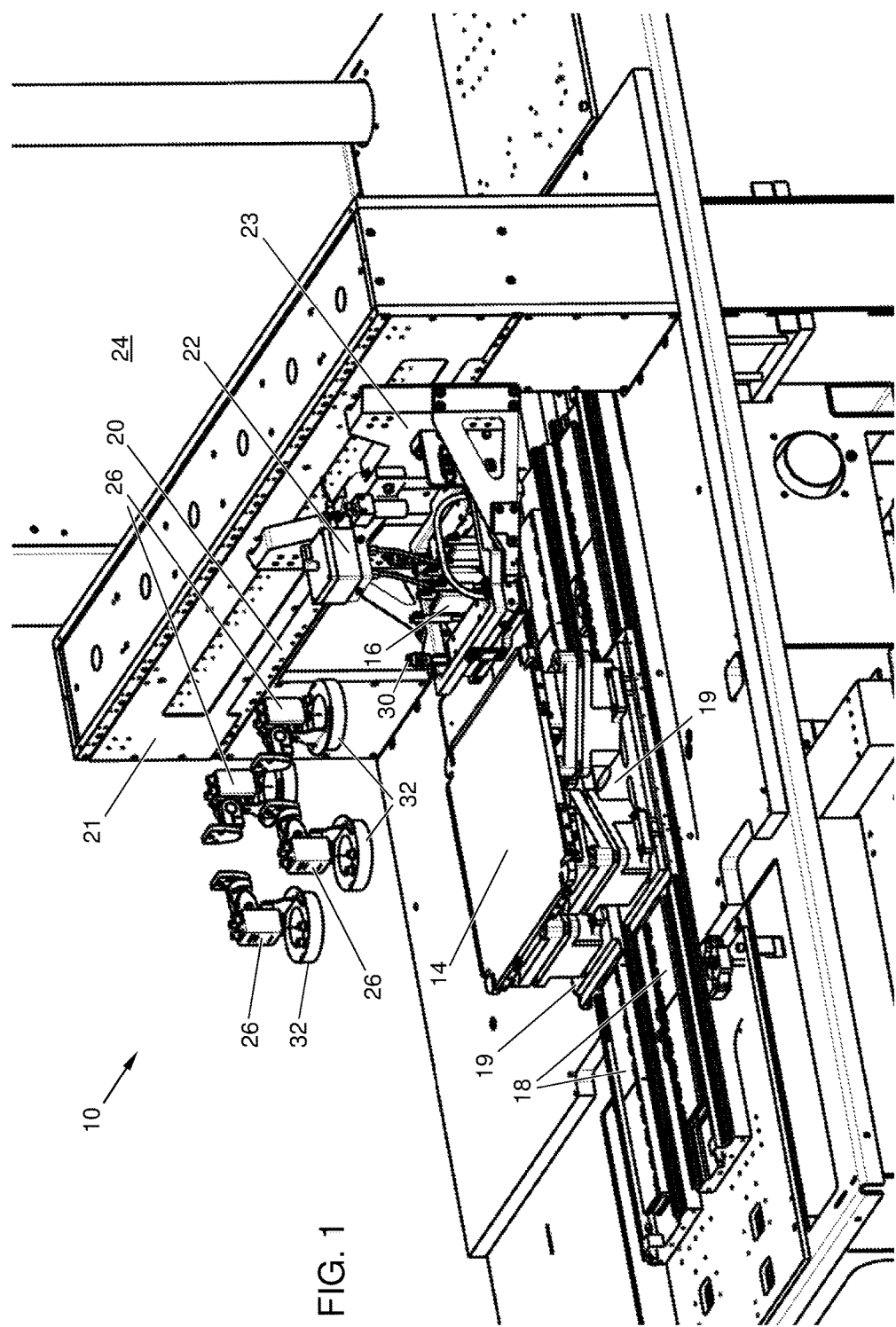
FIG. 1 shows a perspective view of an example of an inkjet printing system in which various embodiments of the invention are implemented.

The figures show an example of an inkjet printing system in which various embodiments of the invention are incorporated. It should be noted that the embodiments can also be applied independently and that the invention is not limited to the example which is shown in the figures. Below, various embodiments will be described, whereby reference numbers will be used to refer to the figures. The reference numbers are used herein for clarification but do not have a limiting effect. An embodiment may also be implemented in a different manner than the example shown in the drawing.

In the most general terms, the disclosure relates to an inkjet printing system 10 configured to inkjet patterns of liquid material on substrates W that each have a length and a width or, alternatively, a diameter. The advantages of the inkjet printing system 10 have been discussed in the summary, to which reference is made here. An example of such an inkjet printing system 10 is shown in FIG. 1.

Each substrate W includes at least two substrate reference marks $W_1$, $W_2$ that are spaced from each other at a distance which is larger than at least half of one of the length, the width and the diameter of the substrate. As explained in the summary, a substrate reference mark may be a fiducial mark that is applied to the substrate. Alternatively, a substrate reference mark may also be a structural feature of the substrate such as a corner of the substrate or a structural feature on the surface of the substrate.

The system includes at least one chuck 14 on which a substrate W can be placed. Each chuck 14 has a length and a width or, alternatively, a diameter and includes at least two visual chuck reference marks $F_1$, $F_2$. The at least two visual chuck reference marks $F_1$, $F_2$ are spaced apart from each other at a distance which is larger than at least half of one of the length, the width or the diameter of the chuck.

The placement of the substrate W on the chuck 14 will be performed automatically by a substrate handling system, such as a substrate pick and place assembly that is configured to pick up substrates W that are supplied and to place the picked up substrates W on the at least one chuck 14 of the inkjet printing system 10. To that end, the substrate handling system may include at least one suction head that is configured to pick up a single substrate W. The substrate handling system may be a part of the inkjet printing system 10 but that does not have to be the case. The substrate handling system may be supplied separately and be positioned adjacent the inkjet printing system 10 for example next to or partly above the inkjet printing system 10.

The inkjet printing system 10 further comprises at least one inkjet printing head 16 that includes at least one nozzle wherein the at least one nozzle is configured to discharge liquid when the nozzle is fired by a control signal. The liquid that is discharged by the nozzle may take the form of a droplet or a continuous flow. The inkjet printing system also comprises a printing motion assembly 18, 20 that supports at least one of the at least one chuck 14 and the at least one inkjet printing head 16 so that a two dimensional printing area on the at least one chuck 14 can be covered with liquid discharged by the at least one printing head 16. The printing motion assembly may be configured to move the at least one printing head 16 relative to the chuck 14 both in X- and Y-direction. This may be effected by moving only the printing head 16 or by moving only the chuck 14. Alternatively, the relative X-Y-movement may also be effected by moving the printing head 16 in X-direction and by moving the chuck 14 in Y-direction or vice versa. The printing motion assembly may also be configured to rotate the chuck along a Z-axis which extends perpendicularly to the support surface of the chuck 14.

In an embodiment, each inkjet printing head 16 includes a plurality of nozzles. In the example shown in FIG. 1, the printing motion assembly includes two guides 18 extending in a Y-direction on which the tables 19 that are both connected with the chuck 14 are movable along the Y-direction. The inkjet printing system 10 shown in the example includes a portal 21 that extends over the first guides 18 transversally in an X-direction. The portal 21 includes a second guide 20 on which a carriage 23 is movable along the X-direction. The carriage 23 carries the at least one printing head 16. The combined movement in X- and Y-direction provides the possibility of covering a two dimensional area with liquid that is discharged by the at least one printing head 16. In an alternative embodiment, the chucks may be fixed and the portal 21 may be movable in the Y-direction. In yet another alternative embodiment the at least one printing head 16 may be fixed and the chuck 14 may be movable in both X- and Y-direction. The chucks 14 may also be rotatable around a Z-axis to align a main direction of the printing head with a main direction of a substrate or with a pattern or structure on the substrate. Alternatively or additionally, the at least one printing head 16 may be rotatably mounted around a Z-axis to align a main direction of the printing head 16 with a main direction of a substrate edge or with a pattern or structure on the substrate. The number of chucks 14 may be varied as well in various embodiments. The embodiment of FIG. 1 shows a single chuck 14. However, embodiments with more than one chuck 14 are feasible as well.

The printing assembly 10 includes an electronic controller assembly 22, 24 that is configured to produce control signals to fire the at least one nozzle and that is configured to control the printing motion assembly 18, 20 for positioning the at least one printing head 16 relative to the at least one chuck 14 so that the positioning variation with which the liquid is deposited relative to the chuck is less than a first threshold value. The positioning variation is a quantity of length expressed, for example, in the unit micrometers. It will be clear that the electronic controller assembly 22, 24 may include various electronic controller units that are in communication with one another. For example, the printing head 16 may have its own controller unit 22 producing the control signals for firing the nozzles. The printing motion assembly may have one or more electronic controller units, for example, one controller unit for each drive. A master controller 24 may communicate with the various drive controllers and the printing head controller 22 to coordinate the various drive controllers and the printing head controller 22.

Each reference mark $F_1$, $F_2$ of the at least one chuck 14 is associated with an associated camera 26 that is directed to the associated chuck reference mark $F_1$ or $F_2$. Each camera 26 has a two dimensional matrix of camera pixels. Each pixel of a said camera 26 has a pixel coordinate. The cameras 26 may be relatively simple and low cost CCD-cameras.

Figure 2:
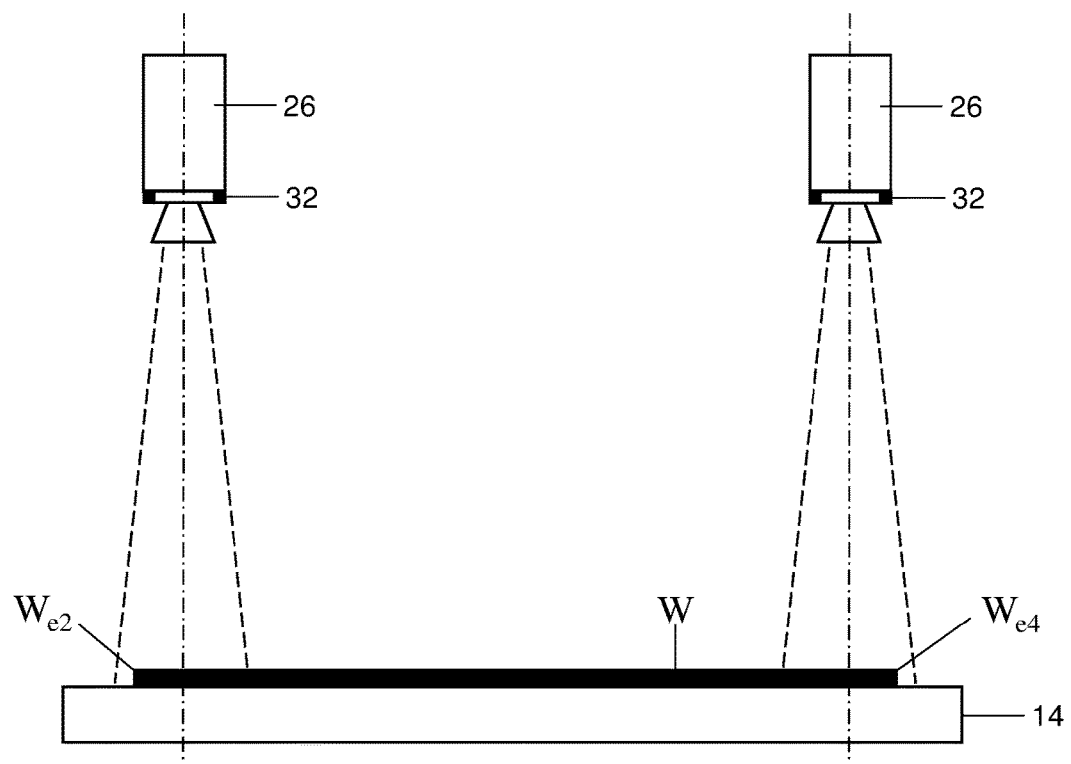
FIG. 2 shows a schematic elevation view of a chuck with two associated cameras.
Figure 3:
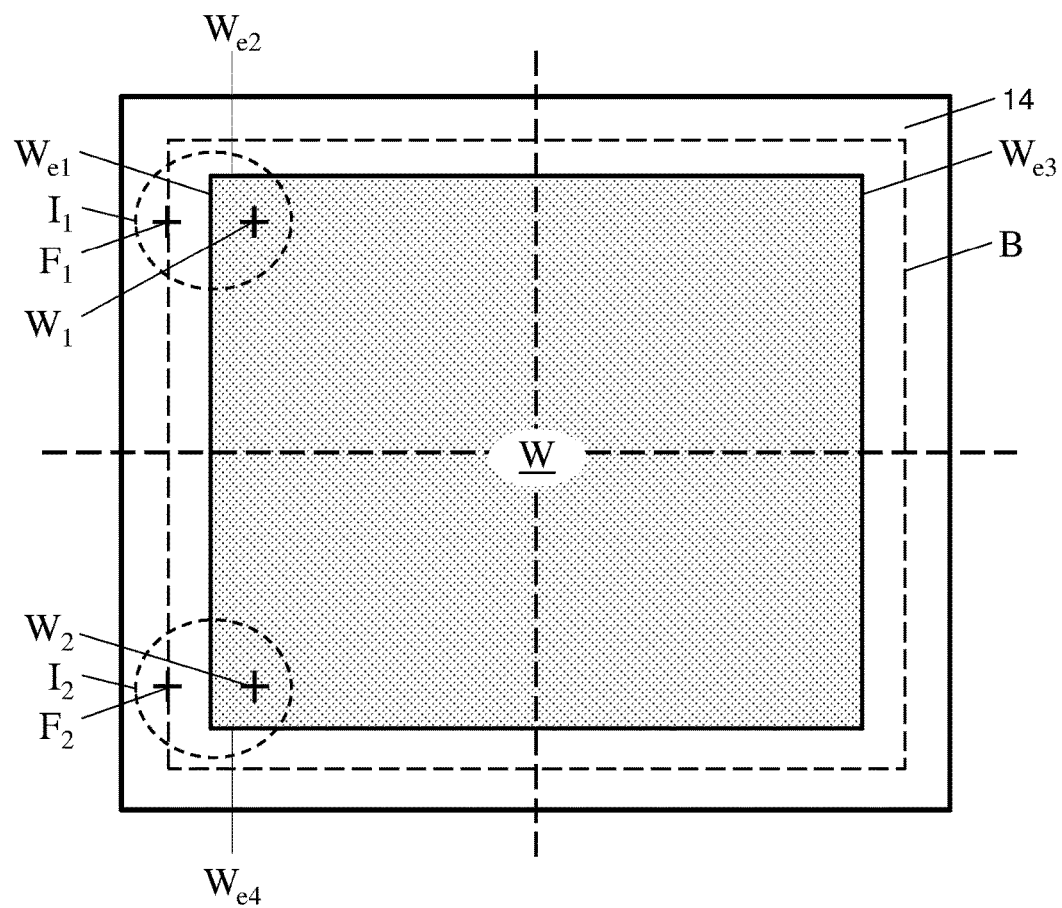
FIG. 3 shows top view of the inkjet printing system of FIG. 2.

FIG. 2 shows a schematic elevation view of a chuck 14 with two associated cameras 26. The figure clearly shows that the cameras 26 are positioned above the chuck 14 to each take an image $I_1$, $I_2$ of the set of images. The image field of the camera may relatively be small and just be large enough to include a single substrate reference mark $W_1$ or $W_2$ and an associated chuck reference mark $F_1$ or $F_2$. A top view of a chuck 14 with a substrate W placed on it is shown in FIG. 3. FIG. 3 shows the boundaries of two images $I_1$, $I_2$ that are taken by two associated cameras 26. FIG. 3 also shows that the chuck 14 includes a placement area extending within a boundary B. The boundary B may be a virtual boundary on a flat upper face of the chuck 14. In other words, each chuck 14 has a substantially flat upper surface on which a substrate W may be placed. Within the flat surface a specific area is designated to be the placement area. The placement area may be bounded by a boundary B which may not be visible and may not be defined by any structural feature of the chuck 14. It may be just the virtual boundary B within which the substrates W must be placed by the substrate handling system.

Each camera 26 that is associated with a chuck reference mark $F_1$ or $F_2$ is, when a substrate W has been placed in or on the placement area of a said chuck 14, also associated with an associated substrate reference mark $W_1$ or $W_2$, in that an image $I_1$, $I_2$ taken with a said camera 26 includes an associated chuck reference mark $F_1$ or $F_2$ and an associated substrate reference mark $W_1$ or $W_2$.

The visual chuck reference marks $F_1$, $F_2$ may for example be provided as fiducials on the chuck surface, as can be seen in FIG. 3. The orientation and positioning of the reference marks may differ for different chucks. The reference marks may for example be positioned on the boundary B of the placement area. For circular substrates, the reference marks may however also be provided on the single circular boundary line B. The diameter of boundary line B will be slightly larger than the diameter of a circular substrate that is to be processed. This results in the chuck reference marks $F_1$, $F_2$ being positioned directly adjacent to the substrate edge of a substrate W, when the substrate is placed on the chuck 14.

Similarly, the substrate reference marks $W_1$, $W_2$ that are provided on the substrate W can be positioned in various configurations. Most preferably, the substrate reference marks $W_1$, $W_2$ are positioned in conjunction with the configuration of the chuck reference marks $F_1$, $F_2$ on the chuck 14. The substrate reference marks $W_1$, $W_2$ may for example be positioned along a substrate edge $W_{e1}$, $W_{e2}$.

It will be clear that many variations of the visual chuck reference marks $F_1$, $F_2$ and the substrate reference marks $W_1$, $W_2$ are feasible. Both the number of chuck reference marks $F_1$, $F_2$ and associated substrate reference marks $W_1$, $W_2$ may be varied, as long as this number is two or more, as well as the position of such reference marks $F_1$, $F_2$, $W_1$, $W_2$ may be varied.

The controller assembly 22, 24 mentioned above is configured to control the at least two cameras 26 to take a set of images each instance a substrate W has been placed on that chuck 14. Each camera 26 takes a single image $I_1$, $I_2$ of the set of images. Each single image $I_1$, $I_2$ of the set of images includes an associated chuck reference mark $F_1$ or $F_2$ and an associated substrate reference mark $W_1$ or $W_2$.

Additionally, the controller assembly 22, 24 is configured to determine, for each set of images, the position of the chuck 14 relative to the at least two cameras 26 by detecting, for each image $I_1$, $I_2$ of the set of images, the position of a said chuck reference mark $F_1$, $F_2$ with respect to the camera pixel coordinates of a said associated camera 26.

Furthermore, the controller assembly 22, 24 is configured to determine, for each set of images, the position of the substrate W relative to the cameras 26 by detecting, for each image $I_1$, $I_2$ of the set of images, the position of a said substrate reference mark $W_1$, $W_2$ with respect to the camera pixel coordinates of a said associated camera;

Based on these two position determinations, the controller assembly 22, 24 is configured to calculate, for each set of images, the substrate position relative to the chuck reference marks $F_1$, $F_2$ and thus relative to the chuck 14 with an accuracy of less than a second threshold value. This accuracy is a quantity of length expressed in, for example, in the unit micrometers. Based on that relative position, the controller assembly 22, 24 is configured to subsequently time the firing of the at least one nozzle of the at least one printing head 16 and control the movement of the printing motion assembly 18, 20 so that the liquid discharged by the inkjet printing head 16 is positioned on the substrate W with a positioning variation which is less than the sum of the first and the second threshold values.

In an embodiment, of which an example is shown in FIG. 3, at least one of the chuck reference marks $F_1$, $F_2$ has a shape that defines a length and a direction. The size of the shape is such that a plurality of pixels of an associated camera 26 is involved for forming a representation of said chuck reference mark $F_1$, $F_2$ in the image $I_1$, $I_2$. By virtue of the fact that a plurality of pixels of an associated camera 26 detects the shape of a chuck reference mark, and because the size and the position of the chuck reference mark $F_1$, $F_2$ on the chuck is fixed and known to the electronic controller, the relative distance between a chuck reference mark $F_1$, $F_2$ and a wafer reference mark $W_1$, $W_2$ can be determined even from a single image $I_1$, $I_2$ of the set of images that is taken. By virtue of the knowledge about the direction of the chuck reference mark $F_1$, $F_2$ in the image $I_1$, $I_2$ the position of the substrate W relative to the chuck reference marks can be determined both in X- and Y-direction as well as in the rotative Z-direction by only using two chuck reference marks $F_1$, $F_2$.

In an embodiment, the first threshold value is 5 micrometer or less. With a printing motion assembly 18, 20 meeting this requirement, the inkjet printing system is able to print patterns on substrates with a repeatable precision. For example for the production of photovoltaic cells this first threshold value suffices to obtain good quality PV-cells.

In an embodiment, the second threshold value is 50 micrometer or less, more preferably 5 micrometer or less. Such accuracy suffices for the production of photovoltaic cells on which the patterns of the guiding tracks are printed with an inkjet printing system as disclosed herein.

In an embodiment, of which an example is shown in the FIG. 3, the inkjet printing system 10 may be configured for processing rectangular substrates W having four substrate edge parts $W_{e1}$, $W_{e2}$, $W_{e3}$, $W_{e4}$. Two substrate edge parts $W_{e1}$, $W_{e3}$ are parallel and extend in a first direction and two other substrate edge parts $W_{e2}$, $W_{e4}$ are also parallel and extend in a second direction. The first and the second direction are substantially orthogonal. In this embodiment, the placement area is substantially rectangular and bounded by four virtual boundary lines B which extend parallel to the substrate edge parts. The at least two chuck reference marks $F_1$, $F_2$ are positioned on the boundary lines. Rectangular substrates may, for example, be used for the production of photovoltaic cells manufactured from Si. In an alternative embodiment, which is not shown in the figures, the substrates to be processed may be circular and have a single substrate edge $W_e$. In this embodiment, the placement area is bounded by a single circular boundary line. The at least two chuck reference marks $F_1$, $F_2$ are positioned on the single boundary line. Circular substrates are, for example, used in the production of chips and LEDs or MEMS. It should be noted that term circular also includes substrates that are substantially circular but that have, for example, a notch in the circumferential edge or a circular edge of which one section is straight. Such features may be used to be able to rotationally orientate the circular substrate during various process steps.

By virtue of the fact that in these last two embodiments the chuck reference marks $F_1$, $F_2$ are positioned on the boundary lines B, the chuck reference marks $F_1$, $F_2$ will be relatively close to the substrate edges $W_{e1}$, $W_{e2}$, $W_{e3}$, $W_{e4}$. The associated substrate reference marks $W_1$, $W_2$ may, in an embodiment, also be positioned relatively close to the substrate edges $W_{e1}$, $W_{e2}$, $W_{e3}$, $W_{e4}$ Consequently, each chuck reference mark and substrate reference mark $F_1$, $W_1$, $F_2$, $W_2$ that are associated with each other to form a pair of which an image $I_1$, $I_2$ will be taken are relatively close together so that the field of view of the associated camera 26 that takes the image $I_1$, $I_2$ may be small. Cameras with a small field of view require a small number of pixels and are therefore relatively low in cost.

In an embodiment, each chuck may include at least three chuck reference marks $F_1$, $F_2$, $F_3$ and each substrate may include at least three substrate reference marks $W_1$, $W_2$, $W_3$ that are each associated with an associated one of the at least three chuck reference marks $F_1$, $F_2$, $F_3$. With three reference marks $F_1$, $F_2$, $F_3$ on the chuck 14 and three associated reference marks $W_1$, $W_2$, $W_3$ on the substrate the relative position both in X- and in Y-direction as well as the relative rotational orientation in Z-direction can be determined even more accurately with a set of images including just three images. Preferably, the distances between the chuck reference marks $F_1$, $F_2$, $F_3$, and consequently also the distances between the associated substrate reference marks $W_1$, $W_2$, $W_3$, are as large as possible and are in the order of the length, the width or the diameter of the substrate W. The greater the distances between the chuck reference marks $F_1$, $F_2$, $F_3$ are, the more accurate the position determination of the substrate W relative to the chuck 14 can be performed.

In an embodiment, of which an example is shown in FIG. 1, each inkjet printing head 16 may be associated with a calibration camera 30 that is fixedly connected to the associated inkjet printing head 16. The calibration camera 30 may be configured to measure the position of an amount of liquid that is discharged by the associated inkjet printing head 16 on one of the at least one chucks 14 or on a substrate W that is positioned on that chuck 14. The measurement of the position of the amount of liquid is effected relative to the chuck 14 so as to determine the position of the inkjet printing head 16 relative to the chuck 14 for the purpose of calibration of the system. Such a calibration may be performed after maintenance of the system or after having processed a large number of substrates W, wherein the measurement of the position with the calibration camera has an accuracy which is less than a third threshold value. This accuracy is a quantity of length, for example, expressed in the unit of micrometers.

In an embodiment, the third threshold value may be 5 micrometer or less. It is explicitly not intended that the calibration takes place after each and every substrate W that has been processed by the inkjet printing system 10. The amount of liquid may, for example, be one or more liquid droplets or a continuous flow of liquid to form a track of liquid on the chuck 14 or substrate W.

Such a calibration camera 30 is advantageous for determining the position of a printing head 16 of the system relative to a chuck 14 of the system very precisely. Because this calibration only has to be performed once in a while, for example, after maintenance of the printing head 16 or after having processed several thousands of substrates W, it has virtually no bearing on the production capacity of the inkjet printing system.

In an embodiment, of which an example is shown in the figures, each camera 26 may have an associated ring light source 32 that has a central axis C that is collinear with a camera axis C of the associated camera 26. The ring light source 32 directs light to an associated chuck mark reference $F_1$, $F_2$.

The ring light source 32 of a camera 26 sheds light on the chuck 14 with the substrate W in a uniform manner without unwanted shadows. This is beneficial for the quality of the image I that is taken by the camera 26 that is associated with the ring light source 32.

The invention also provides a method for inkjetting patterns of liquid material on substrates W. The method includes:
providing an inkjet system 10 according to the invention; and repeating for the processing of each substrate W the following steps:
picking up a substrate W and placing a substrate on a said chuck 14;
controlling the at least two cameras 26 of said chuck 14 to take a set of images, with each camera 26 of said at least two cameras 26 taking a single image $I_1$, $I_2$ of the set of images, wherein each single image $I_1$, $I_2$ of the set of images includes an associated chuck reference mark $F_1$ or $F_2$ and an associated substrate reference mark $W_1$ or $W_2$;
determining the position of the chuck 14 relative to the at least two cameras 26 by detecting for each image $I_1$, $I_2$ of the set of images the position of a said chuck reference mark $F_1$, $F_2$ with respect to the camera pixel coordinates of a said associated camera 26; and
determining the position of the substrate W relative to the at least two cameras 26 by detecting for each image $I_1$, $I_2$ of the set of images the position of a said substrate reference mark $W_1$, $W_2$ of the substrate W with respect to the camera pixel coordinates of a said associated camera 26;
using these two position determinations to calculate the substrate position relative to the chuck reference marks $F_1$, $F_2$ and thus relative to the chuck 14 with an accuracy of less than the second threshold value and, based on that relative position, subsequently timing the firing of the at least one nozzle of the at least one printing head 16 and controlling the movement of the printing motion assembly 18, 20 with a positioning variation of less than the first threshold value so that the liquid discharged by the inkjet printing head 16 is positioned on the substrate W with a positioning variation which is less than the sum of the first and the second threshold values.

As explained above, the method can be performed with a relatively low cost camera assembly. A high number of substrates may be processed with a very high accuracy without the necessity to frequently calibrate the system because the position of the cameras 26 relative to the chuck 14 are not relevant for determining the relative position of the substrate W relative to the chuck 14. Per chuck 14, the substrate production for photovoltaic cells may be typically at least four substrates per chuck per minute. This means that the production capacity of large substrates, for example substrates with a size of 120×60 cm, may be 4*60=240 substrates per hour per chuck 14. By virtue of the inkjet printing system and the method according to the invention, the time that needs to be spent to calibration of the system is minimized because the exact position of the cameras 26 relative to the printing motion assembly and the inkjet printing head 16 is not relevant for the accuracy of the determination of the position of the substrate W relative to the chuck 14. Calibration may have to be performed when the inkjet printing head 16 or the printing motion assembly has been serviced because the relative position between these parts is of the essence for being able to accurately deposit inkjet printing liquid on the substrate during production. Such service does not occur very often and therefore a large number of substrates may be processed after each other without any time being lost for calibration activities. Another reason that may necessitate calibration may be a variation in the environmental condition such as, for example, the room temperature.

In an embodiment, the first threshold value is 5 micrometer or less and the second threshold value is 50 micrometer or less, preferably 5 micrometer or less. With such thresholds, for example, the tracks on PV-cells can be printed with sufficient precision to obtain good quality PV-cells. For other applications of the inkjet printing system 10 other threshold values may be feasible.

In an embodiment, wherein the inkjet printing system 10 includes a calibration camera 30 that is fixedly connected to the associated inkjet printing head 16, the method may include a calibration operation which is performed after maintenance of the system or after having processed a large number of substrates. Such calibration operation may include:
determining a said inkjet printing head 16 and a said chuck 14 of which the relative position have to be calibrated;
positioning the inkjet printing head 16 above the chuck 14 of which the relative position has to be calibrated;
discharging an amount of liquid from the inkjet printing head 16 on the chuck 14 or on a substrate placed W on that chuck 14;
activating the calibration camera 30 that is fixedly connected to the inkjet printing head 16;
performing a measurement with the calibration camera 30 to determine with an accuracy of less than the third threshold value the position of the amount of liquid that is discharged by the associated inkjet printing head 16 relative to the chuck 14, more particular relative to the visual chuck reference marks $F_1$, $F_2$ of the chuck 14; and
on the basis of that measurement determining the position of the inkjet printing head 16 relative to the chuck 14 for the purpose of calibration.

In elaboration of the embodiment, the third threshold value may be 5 micrometer or less. By virtue of the presence of a calibration camera, it is ensured that the inkjet printing system 10 remains accurate and precise even if the at least one printing head as been removed for maintenance or when several thousands of substrates W have been processed.

In an embodiment of the method that includes a calibration step, the amount of liquid that is discharged to perform a measurement with the calibration camera on the position of the amount of liquid that is discharged from the associated inkjet printing head 16 may be at least one liquid drop or may be at least one liquid track.

In order to minimize the time for determining the position of the substrate W relative to the chuck, it is beneficial that the electronic controller assembly 22, 24 is configured for simultaneously activating the respective cameras 26 of the system when a set of images has to be taken. As such the method includes in an embodiment that the images $I_1$, $I_2$ of each set of images are taken simultaneously.

The various embodiments which are described above may be implemented independently from one another and may be combined with one another in various ways. The reference numbers used in the detailed description and the claims do not limit the description of the embodiments nor the claims and are solely used to clarify.

The invention claimed is:

1. An inkjet printing system configured to inkjet patterns of liquid material on substrates that each have a length and a width or, alternatively, a diameter, wherein each substrate includes at least two substrate reference marks that are spaced from each other at a distance which is larger than at least half of the length, the width or the diameter of the substrate, the inkjet printing system including:
    at least one chuck on which a substrate can be placed, each chuck having a length and a width or, alternatively, a diameter and including at least two visual chuck reference marks that are spaced apart from each other at a distance which is larger than at least half of the length, the width or the diameter of the chuck;
    at least one inkjet printing head that includes at least one nozzle that is configured to discharge liquid when the nozzle is fired by a control signal;
    a printing motion assembly that supports at least one of the at least one chuck and the at least one inkjet printing head so that a two dimensional printing area on the at least one chuck can be covered with liquid discharged by the at least one printing head; and
    an electronic controller assembly configured to produce control signals to fire the at least one nozzle and configured to control the printing motion assembly for positioning the at least one printing head relative to the at least one chuck so that the positioning variation with which the liquid is deposited relative to the chuck is less than a first threshold value,
    wherein:
        each reference mark of the at least one chuck is associated with an associated camera that is directed to the associated chuck reference mark, each camera having a two dimensional matrix of camera pixels, each pixel having a pixel coordinate;
        each chuck includes a placement area extending within a boundary; and
        when a substrate has been placed in or on the placement area of a said chuck, each camera that is associated with a chuck reference mark is also associated with an associated substrate reference mark in that an image taken with a said camera includes an associated chuck reference mark and an associated substrate reference mark, and
        the controller assembly is configured:
            to control the at least two cameras to take a set of images each instance a substrate has been placed on that chuck, wherein each camera takes a single image of the set of images, wherein each single image of the set of images includes an associated chuck reference mark and an associated substrate reference mark;
            to determine, for each set of images, the position of the chuck relative to the at least two cameras by detecting, for each image of the set of images, the position of a said chuck reference mark with respect to the camera pixel coordinates of a said associated camera;
            to determine, for each set of images, the position of the substrate relative to the at least two cameras by detecting, for each image of the set of images, the position of a said substrate reference mark with respect to the camera pixel coordinates of a said associated camera; and
            to use these two position determinations to calculate, for each set of images, the substrate position relative to the chuck reference marks and thus relative to the chuck with an accuracy of less than a second threshold value and, based on that relative position, subsequently time the firing of the at least one nozzle of the at least one printing head and control the movement of the printing motion assembly so that the liquid discharged by the inkjet printing head is positioned on the substrate with a positioning variation which is less than the sum of the first and the second threshold values.

2. The inkjet printing system according to claim 1, wherein at least one of the chuck reference marks has a shape that defines a length and a direction, wherein the size of the shape is such that a plurality of pixels of an associated camera is involved for forming a representation of said chuck reference mark in the image.

3. The inkjet printing system according to claim 1, wherein the first threshold value is 5 micrometer or less.

4. The inkjet printing system according to claim 1, wherein the second threshold value is 50 micrometer or less.

5. The inkjet printing system according to claim 1, wherein the system is configured for processing rectangular substrates having four substrate edge parts of which two substrate edge parts are parallel and extend in a first direction and of which two other substrate edge parts are parallel and extend in a second direction, wherein the first and the second direction are substantially orthogonal, wherein the placement area is substantially rectangular and bounded by four boundary lines which extend parallel to the substrate edge parts, and wherein the at least two chuck reference marks dare positioned on the boundary lines.

6. The inkjet printing system according to claim 1, wherein the substrates to be processed are circular and have a single substrate edge, and wherein the placement area is bounded by a single circular boundary line wherein the at least two chuck reference marks are positioned on the single boundary line.

7. The inkjet printing system according to claim 1, wherein each chuck includes at least three chuck reference marks and wherein each substrate includes at least three substrate reference marks that are each associated with an associated one of the three chuck reference marks.

8. The inkjet printing system according to claim 1, wherein each inkjet printing head is associated with a calibration camera that is fixedly connected to the associated inkjet printing head and that is configured to measure the position of an amount of liquid that is discharged by the associated inkjet printing head on one of the at least one chucks or on a substrate that is positioned on that chuck, wherein the measurement of the position of the amount of liquid is effected relative to the chuck so as to determine the position of the inkjet printing head relative to the chuck for the purpose of calibration of the system to be performed after maintenance of the system or after having processed a large number of substrates, and wherein the measurement of the position with the calibration camera has an accuracy which is less than a third threshold value.

9. The inkjet printing system according to claim 8, wherein the third threshold value is 5 micrometer or less.

10. The inkjet printing system according to claim 1, wherein each camera has an associated ring light source that has a central axis that is collinear with a camera axis of the associated camera, and wherein the ring light source directs light to an associated chuck reference mark.

11. A method for inkjetting patterns of liquid material on substrates, the method including:
   providing the inkjet system according to claim 1; and repeating for the processing of each substrate the following steps:
   picking up a substrate and placing a substrate on a said chuck;
   controlling the at least two cameras associated with said chuck to take a set of images, with each camera of said at least two cameras taking a single image of the set of images, wherein each single image of the set of images includes an associated chuck reference mark and an associated substrate reference mark;
   determining the position of the chuck relative to the at least two cameras by detecting for each image of the set of images the position of a said chuck reference mark with respect to the camera pixel coordinates of a said associated camera;
   determining the position of the substrate relative to the at least two cameras by detecting for each image of the set of images the position of a said substrate reference mark of the substrate with respect to the camera pixel coordinates of a said associated camera; and
   using these two position determinations to calculate the substrate position relative to the chuck reference marks and thus relative to the chuck with an accuracy of less than the second threshold value and, based on that relative position, subsequently timing the firing of the at least one nozzle of the at least one printing head and controlling the movement of the printing motion assembly with a positioning variation of less than the first threshold value so that the liquid discharged by the inkjet printing head is positioned on the substrate with a positioning variation which is less than the sum of the first and the second threshold values.

12. The method according to claim 11, wherein the first threshold value is 5 micrometer or less and wherein the second threshold value is 50 micrometer or less.

13. The method according to claim 11, wherein each inkjet printing head is associated with a calibration camera that is fixedly connected to the associated inkjet printing head and that is configured to measure the position of an amount of liquid that is discharged by the associated inkjet printing head on one of the at least one chucks or on a substrate that is positioned on that chuck, wherein the measurement of the position of the amount of liquid is effected relative to the chuck so as to determine the position of the inkjet printing head relative to the chuck for the purpose of calibration of the system to be performed after maintenance of the system or after having processed a large number of substrates, and wherein the measurement of the position with the calibration camera has an accuracy which is less than a third threshold value, and wherein the method includes a calibration operation which is performed after maintenance of the system or after having processed a large number of substrates, wherein the calibration operation includes:
   determining a said inkjet printing head and a said chuck of which the relative position have to be calibrated;
   positioning the inkjet printing head above the chuck of which the relative position has to be calibrated;
   discharging an amount of liquid from the inkjet printing head on the chuck or on a substrate placed on that chuck;
   activating the calibration camera that is fixedly connected to the inkjet printing head
   performing a measurement with the calibration camera to determine with an accuracy of less than the third threshold value the position of the amount of liquid that is discharged by the associated inkjet printing head relative to the chuck, more particular relative to the visual chuck reference marks of the chuck; and
   on the basis of that measurement determining the position of the inkjet printing head relative to the chuck for the purpose of calibration.

14. The method according to claim 13, wherein the third threshold value is 5 micrometer or less.

15. The method of claim 13, wherein the amount of liquid that is discharged to perform a measurement on with the calibration camera is at least one liquid droplet or at least one liquid track.

16. The method according to claim 11, wherein the images of each set of images are taken simultaneously.

* * * * *